United States Patent
Kuraguchi (10) Patent No.: US 10,453,926 B2
(45) Date of Patent: Oct. 22, 2019

(54) NITRIDE-BASED SEMICONDUCTOR DEVICE AND METHOD OF MANUFACTURING THE SAME

(71) Applicant: KABUSHIKI KAISHA TOSHIBA, Minato-ku (JP)

(72) Inventor: Masahiko Kuraguchi, Kanagawa (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/704,139

(22) Filed: May 5, 2015

(65) Prior Publication Data

US 2015/0236103 A1  Aug. 20, 2015

Related U.S. Application Data

(63) Continuation of application No. 11/506,776, filed on Aug. 21, 2006, now abandoned.

(30) Foreign Application Priority Data

Aug. 31, 2005 (JP) ................................ 2005-252657

(51) Int. Cl.
*H01L 29/20* (2006.01)
*H01L 29/66* (2006.01)
(Continued)

(52) U.S. Cl.
CPC ........ *H01L 29/2003* (2013.01); *H01L 29/407* (2013.01); *H01L 29/4236* (2013.01);
(Continued)

(58) Field of Classification Search
CPC ................................................. H01L 29/2003
(Continued)

(56) References Cited

U.S. PATENT DOCUMENTS 6,064,082 A   5/2000 Kawai et al.
6,849,882 B2  2/2005 Chavarkar et al.
(Continued)

FOREIGN PATENT DOCUMENTS

JP  2000-277724  10/2000
JP  2001-274375  10/2001
(Continued)

OTHER PUBLICATIONS

J.P. Ibbetson et al., "Polarization effects, surface states, and the source of electrons in AlGaN/GaN heterostructure field effect transistors", Applied Physics Letters, vol. 77, No. 2, Jul. 10, 2000, pp. 250-252.

(Continued)

*Primary Examiner* — Hsin Yi Hsieh
(74) *Attorney, Agent, or Firm* — Oblon, McClelland, Maier & Neustadt, L.L.P.

(57) ABSTRACT

The nitride-based semiconductor device includes a carrier traveling layer 1 composed of non-doped $Al_xGa_{1-x}N$ ($0 \leq X < 1$); a barrier layer 2 formed on the carrier traveling layer 1 and composed of non-doped or n-type $Al_yGa_{1-y}N$ ($0 < Y \leq 1$, $X < Y$) having a lattice constant smaller than that of the carrier traveling layer 1; a threshold voltage control layer 3 formed on the barrier layer 2 and composed of a non-doped semiconductor having a lattice constant equal to that of the carrier traveling layer 1; and a carrier inducing layer 4 formed on the threshold voltage control layer 3 and composed of a non-doped or n-type semiconductor having a lattice constant smaller than that of the carrier traveling layer 1. The nitride-based semiconductor device further includes a gate electrode 5 formed in a recess structure, a source electrode 6 and a drain electrode 7.

4 Claims, 10 Drawing Sheets

(51) Int. Cl.
 H01L 29/778 (2006.01)
 H01L 29/40 (2006.01)
 H01L 29/423 (2006.01)
 H01L 29/78 (2006.01)
(52) U.S. Cl.
 CPC .... *H01L 29/66462* (2013.01); *H01L 29/7787* (2013.01); *H01L 29/78* (2013.01)
(58) Field of Classification Search
 USPC .......................................................... 257/190
 See application file for complete search history.

(56) References Cited

U.S. PATENT DOCUMENTS

| | | | |
|---|---|---|---|
| 6,982,204 B2 | 1/2006 | Saxler et al. | |
| 2001/0034116 A1* | 10/2001 | Lee | H01L 21/28581 438/604 |
| 2004/0070003 A1* | 4/2004 | Gaska | H01L 29/7783 257/192 |
| 2005/0051796 A1 | 3/2005 | Parikh et al. | |
| 2006/0019435 A1 | 1/2006 | Sheppard et al. | |
| 2006/0108606 A1* | 5/2006 | Saxler | H01L 21/318 257/200 |

FOREIGN PATENT DOCUMENTS

| | | |
|---|---|---|
| JP | 2003-257999 | 9/2003 |
| JP | 2004-22774 | 1/2004 |
| JP | 2005-509274 | 4/2005 |
| JP | 2005-277358 | 10/2005 |
| WO | 02/093650 | 11/2002 |

OTHER PUBLICATIONS

Machine translation of Okamoto, et al., JP 2004-022774.

* cited by examiner

INVERSE NUMBER OF TOTAL THICKNESS OF BARRIER LAYER AND THRESHOLD VOLTAGE CONTROL LAYER $1/(d_1+d_2)$ [1/Å]

NITRIDE-BASED SEMICONDUCTOR DEVICE AND METHOD OF MANUFACTURING THE SAME

CROSS-REFERENCE TO RELATED APPLICATIONS

This application is a continuation of U.S. application Ser. No. 11/506,776 filed Aug. 21, 2006, which is pending. This application is also based upon and claims the benefit of priority from the prior Japanese Patent Application No. 2005-252657, filed on Aug. 31, 2005; the entire contents of which are incorporated herein by reference.

BACKGROUND OF THE INVENTION

1. Field of the Invention

The present invention relates to a semiconductor device, and more particularly to a nitride-based semiconductor device and a method of manufacturing the same.

2. Description of the Related Art

It is effective to use a material having high critical electric field to a power semiconductor device such as a switching device or high frequency power semiconductor device, so that a nitride-based semiconductor material having high critical electric field intensity is used.

As a nitride-based semiconductor device using a conventional nitride-based semiconductor material, a first conventional art has been known in which a carrier traveling layer composed of $Al_XGa_{1-X}N$ ($0 \leq X < 1$) film and a barrier layer composed of $Al_YGa_{1-Y}N$ ($0 < Y \leq 1$, $X < Y$) film are successively laminated, a gate electrode is formed near the central portion on the surface of the barrier layer having the same thickness, and a source electrode and a drain electrode are formed at the positions generally symmetric across the gate electrode.

The AlN film has a lattice constant smaller than that of the GaN film. Therefore, when the Al composition ratio in the barrier layer is greater than the Al composition ratio in the carrier traveling layer, the lattice constant of the barrier layer becomes small compared to the carrier traveling layer, so that a distortion is produced on the barrier layer. In the nitride-based semiconductor device, piezoelectric charge is produced in the barrier layer due to the piezo effect caused by the distortion in the barrier layer. A two-dimensional electron gas is generated at the interface between the carrier traveling layer and the barrier layer due to the generated piezoelectric charge.

When the GaN film having the Al composition of X=0 is used as the carrier traveling layer, and $Al_YGa_{1-Y}N$ film is used as the barrier layer, for example, the carrier density $n_s$ of the two-dimensional electron system to the film thickness $d_1$ of the barrier layer is obtained from the following equation (1) (J. P. Ibbetson et al., "Polarization effects, surface states, and the source of electrons in AlGaN/GaN heterostructure field effect transistors", Applied Physics Letters, 10 Jul. 2000, Vol. 77, No. 2, P. 250-252).

$$n_s = \sigma_{PZ}/\varepsilon \times (1 - T_c/d_1) \ [\text{cm}^{-2}] \quad (1)$$

Here, $\sigma_{PZ}$ is a charge density of piezoelectric charge produced in the barrier layer, $\varepsilon$ is a dielectric constant of the barrier layer, and $d_1$ is the thickness of the barrier layer below the gate electrode. Further, $T_c$ is a critical thickness of the barrier layer in which the carrier is generated. The critical thickness $T_c$ is given by the following equation (2), and it shows a dependency to the Al composition.

$$T_c = 16.4 \times (1 - 1.27 \times Y)/Y \ [\text{Å}] \quad (2)$$

Further, a second conventional art has been known in which, in a nitride-based semiconductor device or gallium arsenide semiconductor device, a recess structure is formed by removing a part of the barrier layer in order to reduce the contact resistance at the source electrode and the drain electrode (for example, JP-A Nos. 2001-274375 and 2004-22774). In a heterojunction field-effect transistor (hereinafter referred to as HJFET) disclosed in JP-A No. 2001-274375, undoped aluminum nitride (AlN) buffer layer, undoped GaN channel layer, n-type AlGaN electron supplying layer, Si monoatomic layer, and n-type GaN cap layer are successively laminated on a sapphire substrate, in which a recess structure is formed by removing the n-type GaN cap layer at the position where the gate electrode is formed, the whole of the Si monoatomic layer and a part of the n-type AlGaN electron supplying layer. The gate electrode is formed at the recess structure, and the source electrode and the drain electrode are formed on the n-type GaN cap layer across the gate electrode. In this nitride-based semiconductor device, the AlGaN layer and the n-type GaN layer are formed between barrier layer and the source electrode/and the drain electrode, to thereby reduce the contact resistance of the source electrode and the drain electrode.

The HJFET disclosed in JP-A No. 2004-22774 has a structure such that a buffer layer composed of a semiconductor layer, GaN channel layer, AlGaN electron supplying layer, n-type GaN layer, and AlGaN layer are successively laminated on a sapphire substrate, in which a recess structure is formed by removing the AlGaN layer at the position where the gate electrode is formed, the whole of the n-type GaN layer and a part of the AlGaN electron supplying layer, the gate electrode is formed at the recess structure on the AlGaN electron supplying layer, and the source electrode and the drain electrode are formed on the AlGaN layer, that is the uppermost layer, across the gate electrode. In this nitride-based semiconductor device, the AlGaN layer and the n-type GaN layer are formed between the barrier layer and the source electrode/the drain electrode, to thereby reduce the contact resistance of the source electrode and the drain electrode.

In the nitride-based semiconductor devices disclosed in JP-A Nos. 2001-274375 and 2004-22774, the AlGaN electron supplying layer corresponds to the barrier layer, and the GaN channel layer below corresponds to the carrier traveling layer. Therefore, as explained in the first conventional art, piezoelectric charge is produced in the barrier layer, and hence, a two-dimensional electron gas is generated at the interface between the carrier traveling layer and the barrier layer. It should be noted that the carrier density of the two-dimensional electron system below the gate electrode in the nitride-based semiconductor device having the recess structure depends upon the Al composition of the barrier layer and the film thickness of the barrier layer below the gate electrode.

When the thickness of the barrier layer is not less than the critical thickness $T_c$ given by the equation (2) in the nitride-based semiconductor device in which the gate electrode and the source and drain electrodes are formed on the barrier layer of the same thickness, the two-dimensional electron system having the uniform carrier density is formed at the interface between the carrier traveling layer and the barrier layer, as shown in the first conventional art. Therefore, the two-dimensional electron system is also formed at the interface between the carrier traveling layer and the barrier layer between the source electrode and the gate electrode and between the drain electrode and the gate electrode, whereby the on-resistance is reduced. However, the carrier density of the two-dimensional electron system is also finitely present below the gate electrode, so that the device becomes a normally on-type nitride-based semiconductor device.

On the other hand, when the thickness of the barrier layer is not more than the critical thickness $T_c$ given by the equation (2), the carrier density of the two-dimensional electron system below the gate electrode becomes zero, so that the device becomes a normally off-type nitride-based semiconductor device. However, the carrier of the two-dimensional electron gas also becomes zero at the interface of the carrier traveling layer and the barrier layer between the gate electrode and the drain electrode and between the gate electrode and the source electrode, other than the portion below the gate electrode, with the result that the resistance between the drain electrode and the source electrode is increased, and hence, on-resistance is also increased. Specifically, it is difficult to fabricate, with good yield, the normally off-type nitride-based semiconductor device having reduced on-resistance in the nitride-based semiconductor device disclosed in the first conventional art.

On the other hand, when the thickness of the barrier layer between the source electrode and the gate electrode and between the drain electrode and the gate electrode is not less than the critical thickness $T_c$ in the nitride-based semiconductor device in which the recess structure is formed by removing a part of the barrier layer in order to reduce the thickness of the barrier layer below the gate electrode, the two-dimensional electron system is formed at the interface of the carrier traveling layer and the barrier layer between the source electrode and the gate electrode and between the drain electrode and the gate electrode, as shown in the second conventional art. Therefore, the on-resistance is reduced. Further, when the thickness of the barrier layer below the gate electrode is not more than the critical thickness $T_c$, the carrier density of the two-dimensional electron system below the gate electrode becomes zero. Accordingly, the nitride-based semiconductor device disclosed in the second conventional art is made into a normally off-type nitride-based semiconductor device.

Meanwhile, considering the difference in energy of the conduction band of the carrier traveling layer and the barrier layer necessary for realizing the two-dimensional electron system, the Al composition ratio Y of the barrier layer is desirably not less than 0.2. In this case, the thickness of the barrier layer for making the carrier density below the gate electrode zero should be not more than about 60 [Å] from the equation (2). Therefore, in order to realize the normally off-type semiconductor device by using the recess structure, it is necessary to successively form the carrier traveling layer, barrier layer, and contact layer by using an epitaxial crystal growth apparatus, and then, to remove a part of the barrier layer to not more than 60 [Å] under a precise control. However, there arises a problem that it is difficult to fabricate a normally off-type semiconductor device with good yield in view of the processing precision.

Further, the threshold voltage in the nitride-based semiconductor device disclosed in the second conventional art becomes (carrier density of two-dimensional electron system below gate electrode)/(gate capacity per unit area), so that the threshold voltage $V_{th}$ is given by the following equation (3).

$$V_{th} = \sigma_{PZ}/\varepsilon \times (d_1 - T_c) \quad (3)$$

Specifically, as shown in the equations (3) and (2), the threshold voltage $V_{th}$ has a dependency to the Al composition ratio of the barrier layer and the thickness thereof. When the Al composition ratio Y of the barrier layer is 0.3, for example, even if processing is performed with relatively high precision such as 10 [Å] in the variation in the thickness of the barrier layer below the gate by the etching for forming the recess structure, the variation in the threshold voltage at this time becomes great such as 0.3 [V]. Accordingly, there arise a problem that it is difficult to fabricate a semiconductor device by controlling the threshold voltage with good yield.

The present invention has been achieved in order to solve the above problems. It is an object of this invention to provide, with good yield, a nitride-based semiconductor device in which a threshold voltage can easily be controlled and which has reduced on-resistance. Further, It is an object of this invention to also provide a normally off-type nitride-based semiconductor device having reduced on-resistance with good yield.

SUMMARY OF THE INVENTION

According to one aspect of the present invention, a nitride-based semiconductor device includes a carrier traveling layer made of non-doped $Al_xGa_{1-x}N$ (0≤X<1); a barrier layer formed on the carrier traveling layer and made of non-doped or n-type $Al_YGa_{1-Y}N$ (0<Y≤1, X<Y) having a lattice constant smaller than that of the carrier traveling layer; a threshold voltage control layer formed on the barrier layer and made of a non-doped semiconductor having a lattice constant equal to that of the carrier traveling layer; a carrier inducing layer formed on the threshold voltage control layer and made of a non-doped or n-type semiconductor having a lattice constant smaller than that of the carrier traveling layer; a gate electrode formed in a recess structure that is formed at a predetermined position of the carrier inducing layer and a bottom of which reaches to the threshold voltage control layer; and a source electrode and a drain electrode formed at any one of the barrier layer, the threshold voltage control layer and the carrier inducing layer across the gate electrode.

According to another aspect of the present invention, a nitride-based semiconductor device includes a first nitride-based semiconductor layer made of non-doped $Al_xGa_{1-x}N$ (0≤X<1); a second nitride-based semiconductor layer formed on the first nitride-based semiconductor layer and made of non-doped or n-type $Al_YGa_{1-Y}N$ (0<Y≤1, X<Y) having a lattice constant smaller than that of the first nitride-based semiconductor layer; a first semiconductor layer formed on the second nitride-based semiconductor layer and made of a non-doped semiconductor having a lattice constant equal to that of the first nitride-based semiconductor layer; a second semiconductor layer formed on the first semiconductor layer and made of a non-doped or n-type semiconductor having a lattice constant smaller than that of the first nitride-based semiconductor layer; a gate electrode formed in a recess structure that is formed at a predetermined position of the second semiconductor layer and a bottom of which reaches to the first semiconductor layer; a source electrode and a drain electrode formed at any one of the second nitride-based semiconductor layer, and the first and second semiconductor layers across the gate electrode.

According to still another aspect of the present invention, a method of manufacturing a nitride-based semiconductor device includes forming a carrier traveling layer made of non-doped $Al_xGa_{1-x}N$ (0≤X<1) on a substrate; forming a barrier layer on the carrier traveling layer, the barrier layer being made of non-doped or n-type $Al_YGa_{1-Y}N$ (0<Y≤1, X<Y) having a lattice constant smaller than that of the carrier traveling layer; forming a threshold voltage control layer on the barrier layer, the threshold voltage control layer being made of a non-doped semiconductor having a lattice constant equal to that of the carrier traveling layer; forming a carrier inducing layer on the threshold voltage control layer, the carrier inducing layer being made of a non-doped or n-type semiconductor having a lattice constant smaller than that of the carrier traveling layer; forming a recess structure by removing a predetermined position of the carrier inducing layer and the threshold voltage control layer so as to expose the threshold voltage control layer; forming a source electrode and a drain electrode on any one of the barrier layer, the threshold voltage control layer and the carrier inducing layer across the recess structure by using a mask on the recess structure; and forming a gate electrode in the recess structure.

According to still another aspect of the present invention, a method of manufacturing a nitride-based semiconductor device includes forming a first nitride-based semiconductor layer made of non-doped $Al_xGa_{1-x}N$ ($0 \leq X < 1$) on a substrate; forming a second nitride-based semiconductor layer on the first nitride-based semiconductor layer, the second nitride-based semiconductor layer being made of non-doped or n-type $Al_yGa_{1-y}N$ (($0 < Y \leq 1$, $X < Y$) having a lattice constant smaller than that of the first nitride-based semiconductor layer; forming a first semiconductor layer on the second nitride-based semiconductor layer, the first semiconductor layer being made of a non-doped semiconductor having a lattice constant equal to that of the first nitride-based semiconductor layer; forming a second semiconductor layer on the first semiconductor layer, the second semiconductor layer being made of a non-doped or n-type semiconductor having a lattice constant smaller than that of the first nitride-based semiconductor layer; forming a recess structure by removing a predetermined position of the second and the first semiconductor layers so as to expose the first semiconductor layer; forming a source electrode and a drain electrode on any one of the second nitride-based semiconductor layer and the first and second semiconductor layers across the recess structure by using a mask on the recess structure; and forming a gate electrode in the recess structure.

DETAILED DESCRIPTION OF THE INVENTION

Preferred embodiments of a nitride-based semiconductor device and a method of manufacturing the same according to the present invention will be explained in detail with reference to the appended drawings. The present invention is not limited to the embodiments. Further, the sectional view of the nitride-based semiconductor device used in the following embodiments are schematic, and the relationship between the thickness and width of the layer and the ratio of the thickness of each layer are different from those of a real device.

Figure 1:
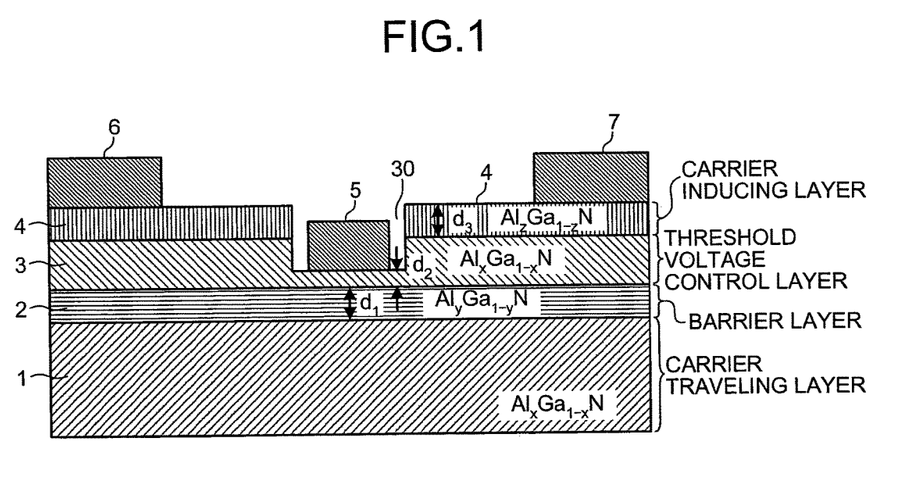
FIG. 1 is a sectional view schematically showing a configuration of a nitride-based semiconductor device according to an embodiment of the present invention.

FIG. 1 is a sectional view schematically showing a configuration of a nitride-based semiconductor device according to this embodiment. This nitride-based semiconductor device has a configuration in which a carrier traveling layer 1 composed of $Al_xGa_{1-x}N$ ($0 \leq X < 1$) that is a non-doped nitride-based semiconductor, a barrier layer 2 composed of $Al_yGa_{1-y}N$ (($0 < Y \leq 1$, $X < Y$) that is a non-doped or n-type nitride-based semiconductor having a lattice constant smaller than that of the carrier traveling layer 1, a threshold voltage control layer 3 composed of a non-doped semiconductor having a lattice constant equal to that of the carrier traveling layer 1, and a carrier inducing layer 4 composed of a non-doped or n-type semiconductor having a lattice constant smaller than that of the carrier traveling layer 1 are successively laminated. A recess structure 30 is formed at the position where a gate electrode 5 is formed by removing the whole of the carrier inducing layer 4 and a part of the threshold voltage control layer 3. The gate electrode 5 is formed at the bottom portion of the recess structure 30, namely, on the threshold voltage control layer 3, and a source electrode 6 and a drain electrode 7 are formed at the position on the carrier inducing layer 4 so as to be generally symmetric across the gate electrode 5. Although the recess structure 30 is formed by removing the whole of the carrier inducing layer 4 and a part of the threshold voltage control layer 3 at the area for forming the gate electrode 5 in FIG. 1, it is sufficient that the carrier inducing layer 4 is removed and the recess structure is not formed on the barrier layer 2. Therefore, only the carrier inducing layer 4 may be removed. Here, the carrier traveling layer 1 corresponds to a first nitride-based semiconductor layer in claims, the barrier layer 2 corresponds to a second nitride-based semiconductor layer, the threshold voltage control layer 3 corresponds to a first semiconductor layer, and the carrier inducing layer 4 corresponds to a second semiconductor layer.

As described above, the threshold voltage control layer 3 may be made of a semiconductor material having a lattice constant equal to that of the carrier traveling layer 1. However, if the threshold voltage control layer 3 and the carrier traveling layer 1 are made of the same material as shown in FIG. 1, they can be manufactured by a single crystal growing device. Therefore, formations of the threshold voltage control layer 3 and the carrier traveling layer 1 with the same material is advantageous compared to the formation with a different material having the same lattice constant. Similarly, the carrier inducing layer 4 may be made of a semiconductor material having a lattice constant smaller than that of the carrier traveling layer 1, but as shown in FIG. 1, if the $Al_zGa_{1-Z}N$ ($0<Z\leq1$, $X<Z$) film is used, the crystal growth can be made with the material same as the carrier traveling layer 1 and the barrier layer 2, thus advantageous.

The thickness of the barrier layer 2 is a thickness not more than a thickness by which a dislocation occurs due to the distortion caused by the difference in the lattice constant of the carrier traveling layer 1. The barrier layer 2 actually has a thickness of about several ten nanometers. Therefore, the lattice constant of the barrier layer 2 substantially becomes equal to the lattice constant of the carrier traveling layer 1, so that the barrier layer 2 has a crystal structure extended in the direction parallel to the substrate surface. Further, the threshold voltage control layer 3 has the lattice constant equal to that of the carrier traveling layer 1 according to this, so that a new distortion never occurs between the threshold voltage control layer 3 and the barrier layer 2. It should be noted that, in the following explanation, the thickness of the barrier layer 2 is defined as $d_1$, the thickness of the threshold voltage control layer 3 at the position where the recess structure 30 is formed is defined as $d_2$, and the thickness of the carrier inducing layer 4 is defined as $d_3$.

This embodiment is characterized in that, instead of the configuration in which the recess structure is formed so as to reach the part of the barrier layer from the surface of the nitride-based semiconductor device as in the conventional example, the recess structure is formed from the surface of the nitride-based semiconductor device to the threshold voltage control layer 3 on the barrier layer 2, and the carrier inducing layer 4 having a lattice constant smaller than that of the carrier traveling layer 1 is provided between the gate electrode 5 and the source electrode 6 and between the gate electrode 5 and the drain electrode 7.

Next, a state of electrons at the interface of the carrier traveling layer 1 and the barrier layer 2 at the position below the gate electrode 5 where the recess structure 30 is formed and the position below the source electrode 6 and the drain electrode 7 where the recess structure 30 is not formed in the nitride-based semiconductor device according to this embodiment will be explained.

Figure 2:
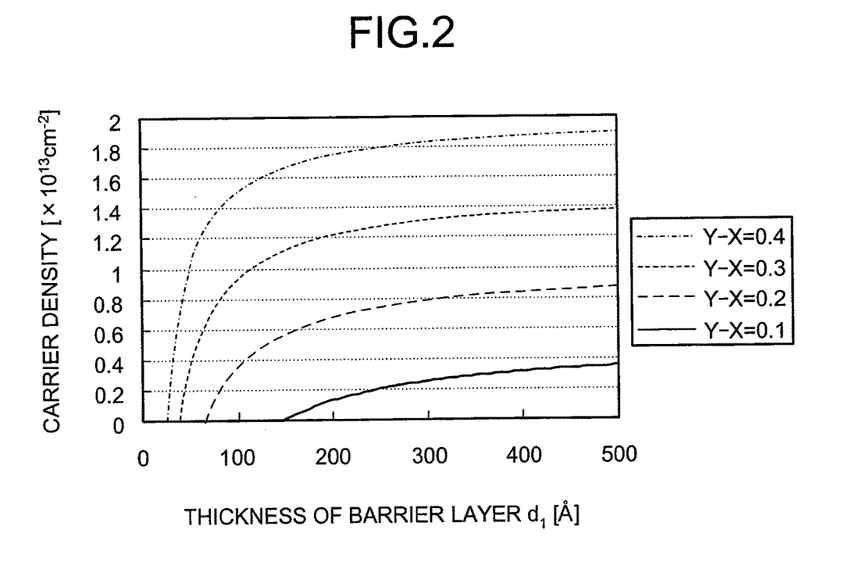
FIG. 2 is a graph showing a relationship between a thickness of a barrier layer and a carrier density in the nitride-based semiconductor device.
Figure 3:
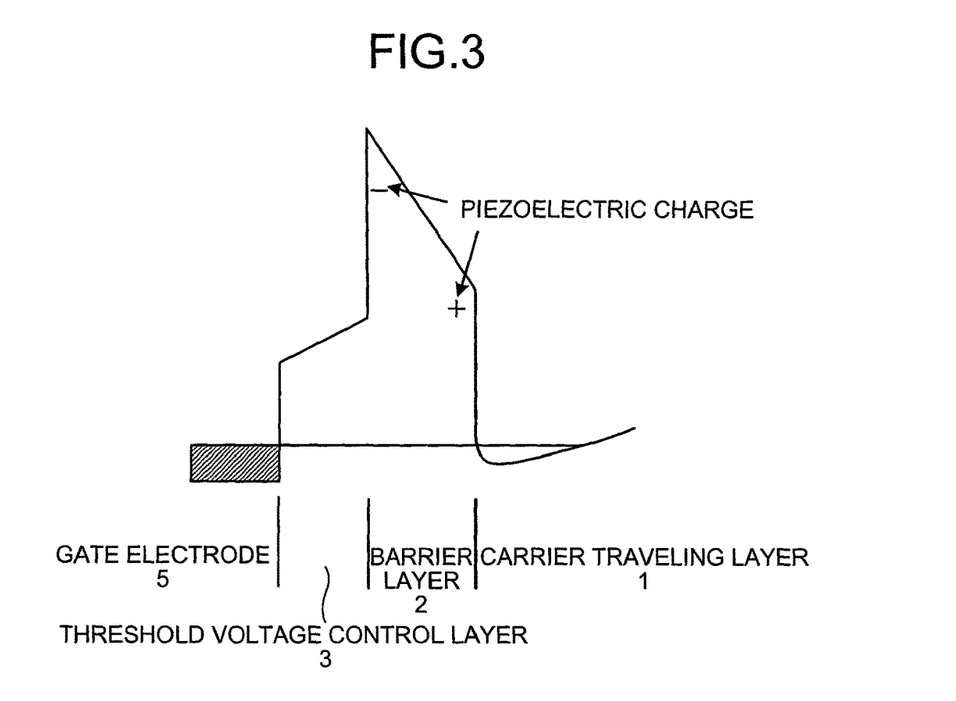
FIG. 3 is a diagram schematically showing an energy state of a conduction band in the depth direction at the position where the gate electrode shown in FIG. 1 is formed.
Figure 4:
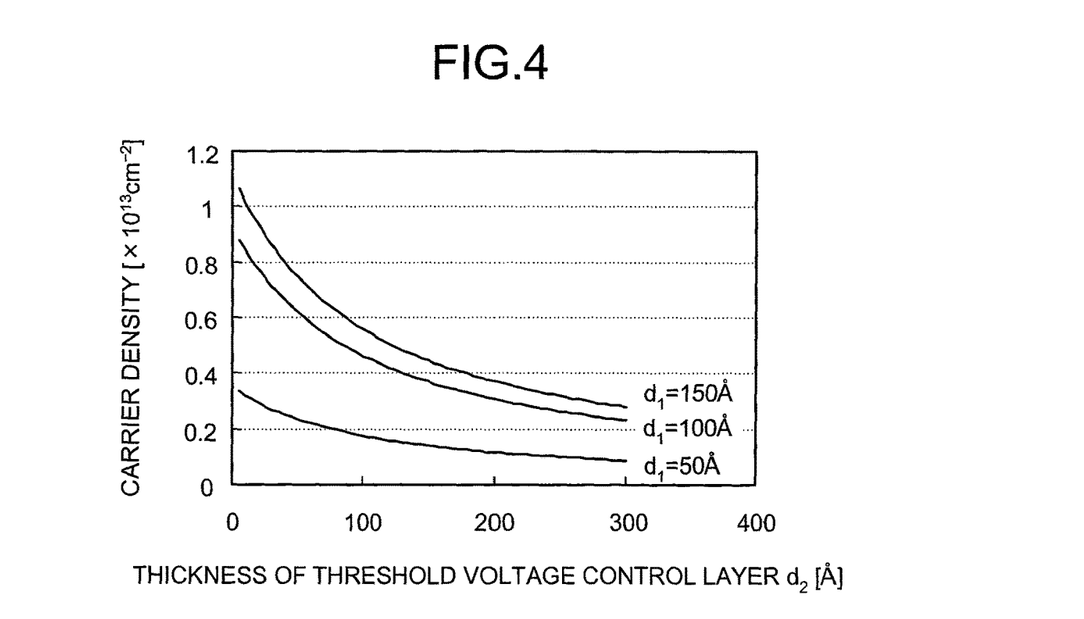
FIG. 4 is a graph showing a carrier density below the gate, when GaN film is used for the carrier traveling layer and $Al_{0.3}Ga_{0.7}N$ film is used for the barrier layer.
Figure 5:
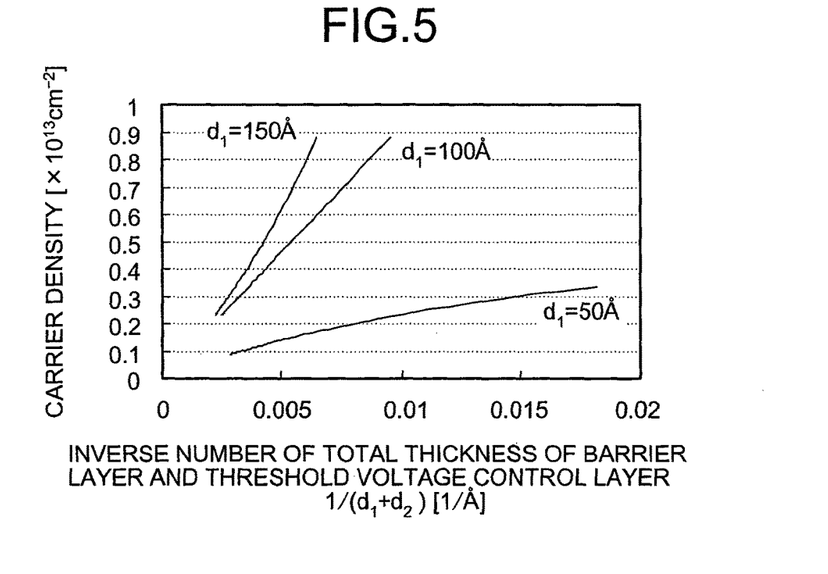
FIG. 5 is a graph showing a dependency of the carrier density to the inverse number of the total thickness of a barrier layer and a threshold voltage control layer.

Firstly, the state of electrons at the interface of the carrier traveling layer 1 and the barrier layer 2 below the gate electrode 5 will be explained. FIG. 2 is a graph showing a relationship between the thickness of the barrier layer and a carrier density in the nitride-based semiconductor device, FIG. 3 is a diagram schematically showing an energy state of a conduction band at the position in the depth direction where the gate electrode shown in FIG. 1 is formed, FIG. 4 is a graph showing a carrier density below the gate, when GaN film is used for the carrier traveling layer and $Al_{0.3}Ga_{0.7}N$ film is used for the barrier layer, and FIG. 5 is a graph showing a dependency of the carrier density to the inverse number of the total thickness of the barrier layer and the threshold voltage control layer.

In the conventional nitride-based semiconductor device explained in the related art, the gate electrode 5 is formed on the barrier layer 2. Therefore, piezoelectric charge depends upon the thickness of the barrier layer 2 below the gate electrode 5. As a result, as the thickness of the barrier layer 2 below the gate electrode 5 increases, the carrier density increases, as shown in FIG. 2.

On the other hand, in the nitride-based semiconductor device in this embodiment, the gate electrode 5 is formed on the threshold voltage control layer 3. Therefore, piezoelectric charge is produced only in the barrier layer 2 at the position where the gate electrode 5 is formed, and not produced in the threshold voltage control layer 3, as shown in FIG. 3, so that the concentration of the piezoelectric charge does not depend on the thickness $d_2$ of the threshold voltage control layer 3 below the gate. Since the concentration of the piezoelectric charge is not changed, the carrier density decreases with the increase in the thickness of the threshold voltage control layer 3 as shown in FIG. 4. The carrier density is in inverse proportion to the total thickness of the barrier layer 2 and the threshold voltage control layer 3 in this case as shown in FIG. 5. Meanwhile, a gate capacity per unit area is also in inverse proportion to the total thickness of the barrier layer 2 and the threshold voltage control layer 3, whereby the threshold voltage represented by (carrier density of two-dimensional electron system under gate electrode)/(gate capacity per unit area) does not vary with respect to the total thickness of the barrier layer 2 and the threshold voltage control layer 3 from this relationship.

Specifically, in the nitride-based semiconductor device shown in FIG. 1, the threshold voltage does not vary with respect to the variation in the etching depth upon forming the recess structure, more specifically, even if the thickness $d_2$ that is left in the threshold voltage control layer 3 varies. Further, the thickness of the barrier layer 2 that is not removed upon forming the recess structure can be strictly controlled by a film-forming technique that enables a crystal growth by an atomic layer control. Therefore, a nitride-based semiconductor device having uniform threshold voltage can be provided with high yield.

Figure 6:
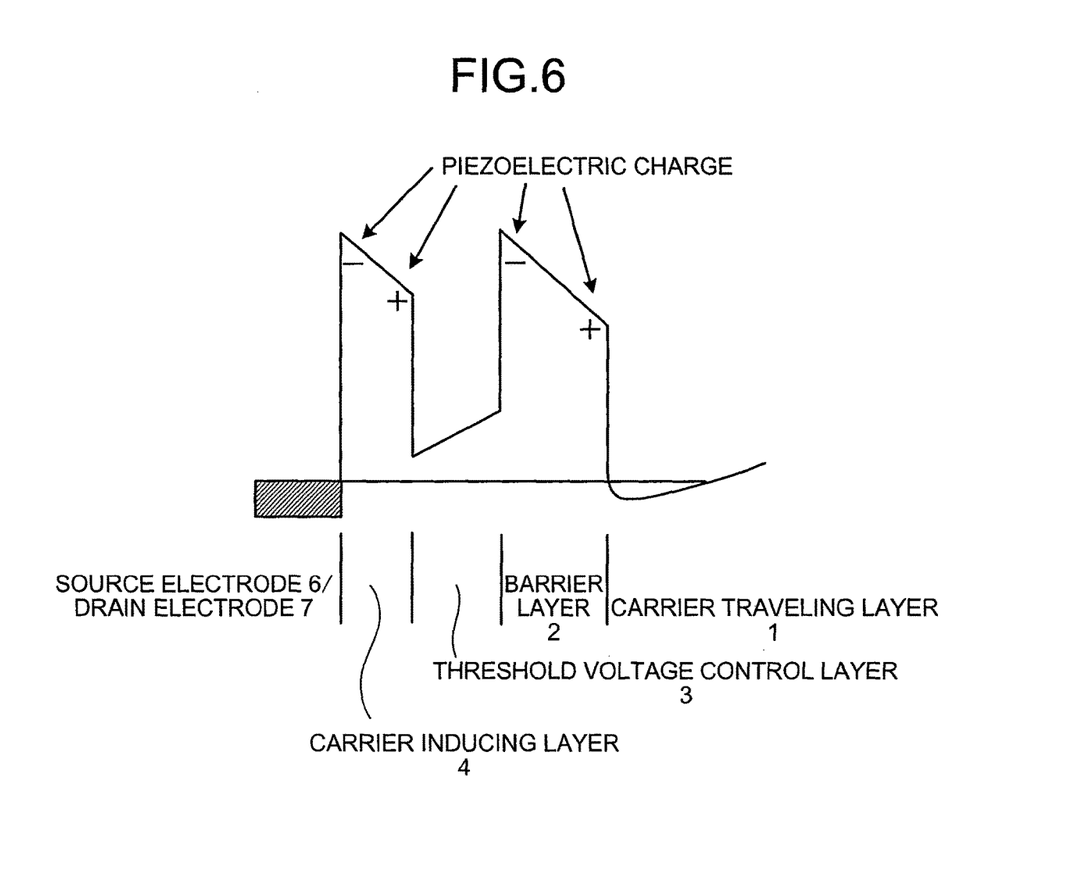
FIG. 6 is a diagram schematically showing an energy state of a conduction band in the depth direction at the position where the source and drain electrodes in FIG. 1 are formed.

Next, a state of electrons at the interface between the carrier traveling layer 1 and the barrier layer 2 at the position where the recess structure 30 is not formed (at the source electrode 6 and the drain electrode 7) will be explained. FIG. 6 is a diagram schematically showing an energy state of a conduction band at the position in the depth direction where the source electrode and the drain electrode in FIG. 1 are formed. In the nitride-based semiconductor device shown in FIG. 1, the carrier inducing layer 4 is formed between the source electrode 6 and the gate electrode 5 and between the drain electrode 7 and the gate electrode 5. The carrier inducing layer 4 has the lattice constant smaller than that in the carrier traveling layer 1 and the threshold voltage control layer 3, so that the piezoelectric charge that is positive at the side of the threshold voltage control layer 3 is produced in the carrier inducing layer 4 as shown in FIG. 6. The potential of the conduction band in the carrier inducing layer 4 has a slope due to the piezoelectric charge, namely, the potential at the side of the carrier traveling layer 1 is low. Further, like the case of FIG. 3, a two-dimensional electron gas is generated at the interface between the carrier traveling layer 1 and the barrier layer 2 due to the piezo effect, which leads to the increase in the carrier density of the two-dimensional electron system produced at the interface between the carrier traveling layer 1 and the barrier layer 2 below the area where the carrier inducing layer 4 is formed. Specifically, the resistance of the two-dimensional electron system below the area where the carrier inducing layer 4 is formed is decreased. As a result, the resistance between the source electrode 6 and the gate electrode 5 and between the drain electrode 7 and the gate electrode 5 is reduced to thereby realize the reduction in on-resistance in the nitride-based semiconductor device shown in FIG. 1 having the carrier inducing layer 4 formed between the source electrode 6 and the gate electrode 5 and between the drain electrode 7 and the gate electrode 5.

It is also possible to realize a further reduction in resistance by increasing the carrier density of the two-dimensional electron or by reducing the contact resistance at the source electrode 6 and the drain electrode 7 with the doping of Si into the carrier inducing layer 4.

In the semiconductor device having the carrier traveling layer 1 composed of a non-doped $Al_xGa_{1-x}N$ ($0 \leq X < 1$) film, the barrier layer 2 composed of $Al_YGa_{1-Y}N$ (($0 < Y \leq 1$, $X < Y$), the threshold voltage control layer 3 composed of a semiconductor having a lattice constant equal to that of the carrier traveling layer 1, and the carrier inducing layer 4 composed of a semiconductor having a lattice constant smaller than that of the carrier traveling layer 1, those of which are successively laminated, the whole of the carrier inducing layer 4 and a part of the threshold voltage control layer 3 at the region where the gate electrode 5 is formed are removed to form the gate electrode 5 on the threshold voltage control layer 3, whereby a nitride-based semiconductor device whose threshold voltage can be controlled with good yield and that has reduced on-resistance can be provided.

Figure 7A:
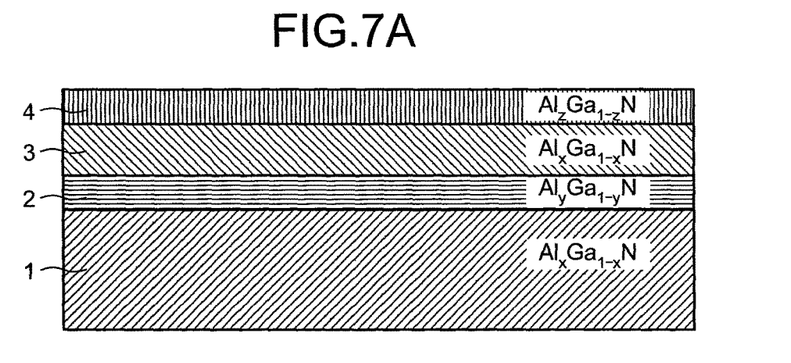
FIGS. 7A to 7F are views schematically showing one example of a procedure of a method for manufacturing a nitride-based semiconductor device according to the present invention.

Subsequently, a method of fabricating the nitride-based semiconductor device according to this embodiment will be explained. FIGS. 7A to 7F are views schematically showing one example of a procedure of a method for manufacturing a nitride-based semiconductor device according to the present invention. Firstly, as shown in FIG. 7A, the carrier traveling layer 1 composed of a non-doped $Al_xGa_{1-x}N$ ($0 \leq X < 1$) film of about 2 μm, the barrier layer 2 composed of a non-doped or n-type $Al_YGa_{1-Y}N$ (($0 < Y \leq 1$, $X < Y$) film of about 10 nm, the threshold voltage control layer 3 composed of a non-doped $Al_xGa_{1-x}N$ ($0 \leq X < 1$) film of about 10 nm, and the carrier inducing layer 4 composed of a non-doped or n-type $Al_zGa_{1-z}N$ ($0 \leq Z < 1$, $X < Z$) film of about 10 nm are successively grown on a substrate (not shown) on which a predetermined film is formed according to need. The carrier traveling layer 1, barrier layer 2, threshold voltage control layer 3 and carrier inducing layer 4 are formed with an epitaxial crystal growth technique such as a MOCVD (Metal Organic Chemical Vapor Deposition, organic metal CVD method) that can control the thickness at a level of atomic layer.

Since the Al composition Y of the barrier layer 2 is greater than the Al composition of the carrier traveling layer 1 ($X < Y$), the lattice constant of the barrier layer 2 becomes smaller than the lattice constant of the carrier traveling layer 1. Similarly, since the Al composition Z of the carrier inducing layer 4 is greater than X ($X < Z$), the lattice constant of the carrier inducing layer 4 becomes smaller than the lattice constant of the threshold voltage control layer 3 (carrier traveling layer 1). Further, epitaxial growth has been made, so that the thickness of the barrier layer 2 and the thickness of the carrier inducing layer 4 are thinner than the thickness by which the dislocation occurs. Therefore, the crystal of the semiconductor film constituting the barrier layer 2 and the carrier inducing layer 4 is grown according to the crystal structure of the lower layer, extended in the direction parallel to the growth surface, and has a distortion.

Figure 7B:
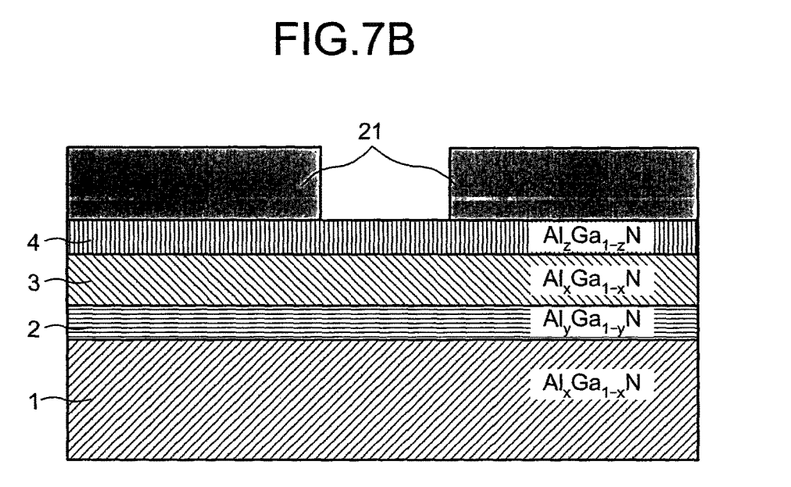

Then, as shown in FIG. 7B, a photoresist film 21 is applied onto the carrier inducing layer 4, whereupon the photoresist film 21 is exposed and developed by a photolithography technique to form an etching mask obtained by removing the photoresist film 21 at the position where the recess structure 30 is formed.

Figure 7C:
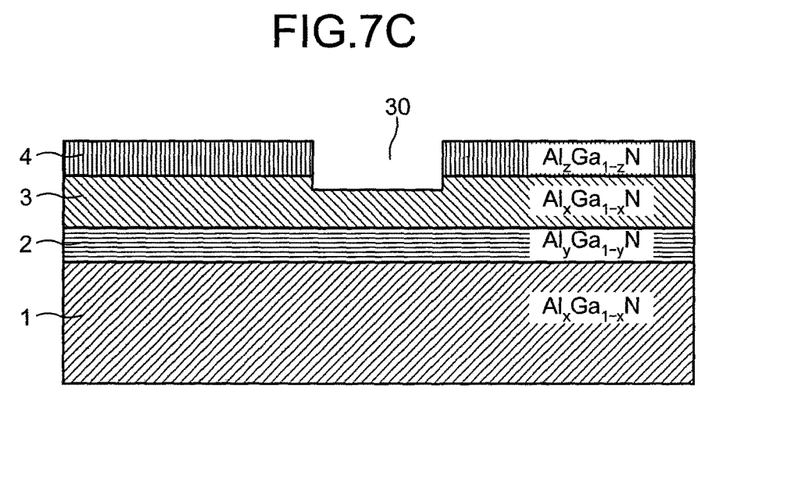

Then, as shown in FIG. 7C, the carrier inducing layer 4 and the threshold voltage control layer 3 are selectively removed to a predetermined depth in the threshold voltage control layer 3 by an etching technique such as a reactive ion etching (RIE) with the use of the etching mask, thereby forming the recess structure 30. In this case, only a part of the threshold voltage control layer 3 is removed. Then, the used etching mask is removed.

Figure 7D:
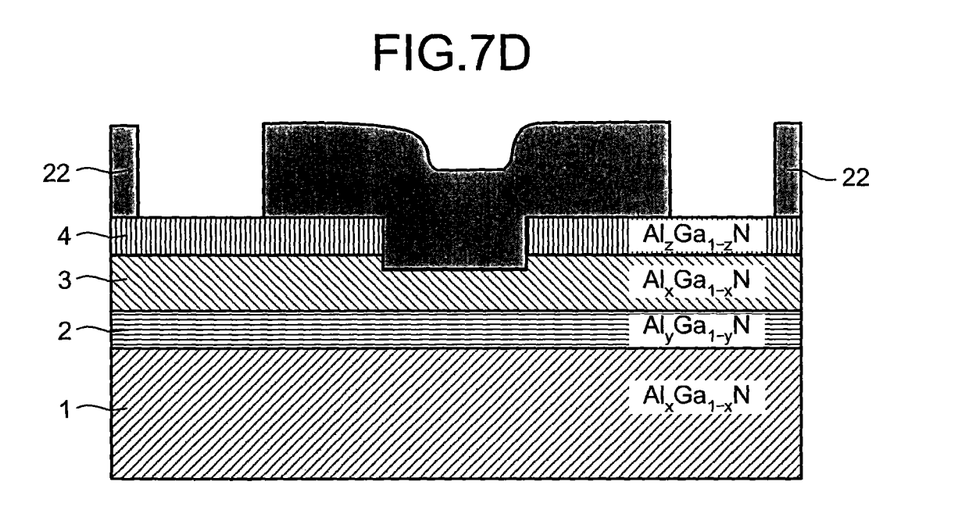

Subsequently, as shown in FIG. 7D, a new photoresist film 22 is applied on the surface at the side where the recess structure 30 is formed, and then, it is exposed and developed by the photolithography technique so as to remove the photoresist film at the regions on the carrier inducing layer 4 where the drain electrode 7 and the source electrode 6 are formed respectively.

Figure 7E:
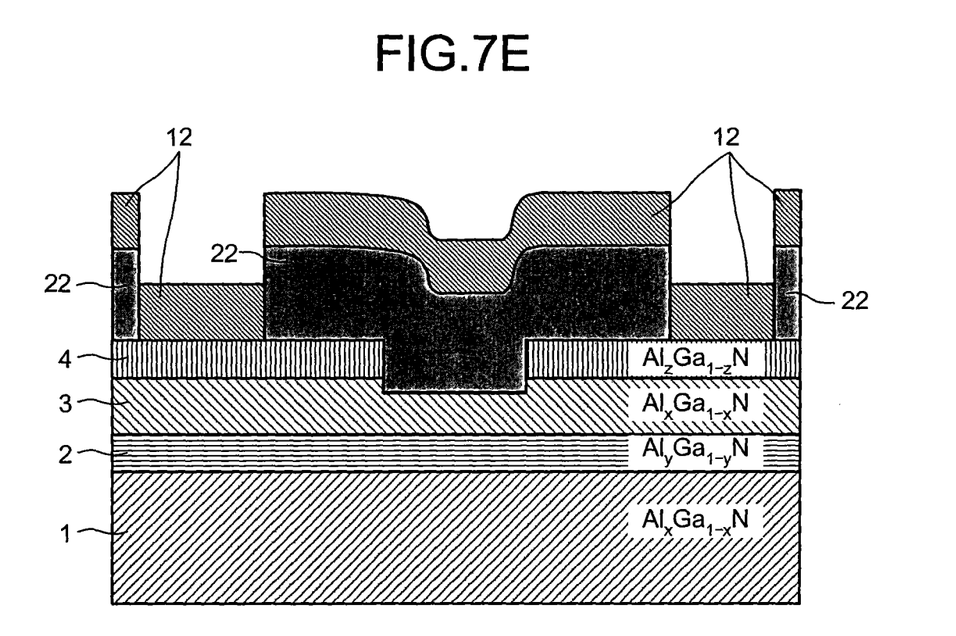

Thereafter, as shown in FIG. 7E, a metal film 12 for an electrode is deposited all over the surface, whereby the electrode metal film 12 is formed at the source/drain region where the photoresist film 22 is removed. Then, the source electrode 6 and the drain electrode 7 are formed by using a lift-off method for removing the photoresist film 22.

Figure 7F:
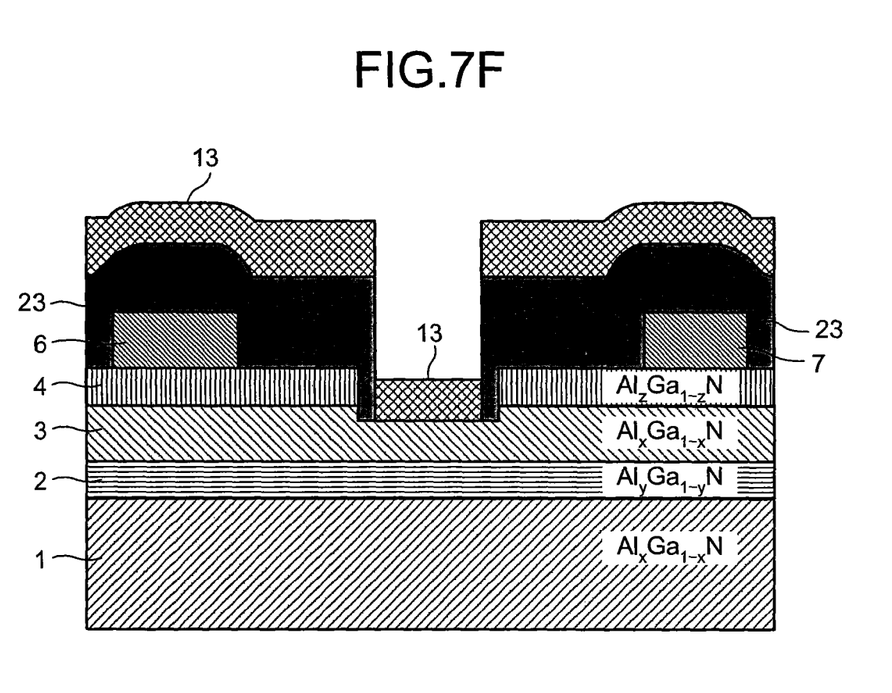

Then, as shown in FIG. 7F, a new photoresist film 23 is applied on the surface at the side where the source electrode 6 and the drain electrode 7 are formed, and it is exposed and developed by the photolithography technique so as to remove the photoresist film at the region on the threshold voltage control layer 3 where the gate electrode 5 is to be formed. Thereafter, a metal film 13 for an electrode is deposited all over the surface, thereby forming the electrode metal film 13 at the region on the threshold voltage control layer 3 where the photoresist film is removed and where the gate electrode 5 is to be formed. Then, the photoresist film 23 is removed by the lift-off method to form the gate electrode 5, whereby the nitride-based semiconductor device shown in FIG. 1 is fabricated.

According to the method of fabricating the nitride-based semiconductor device, the thickness of the barrier layer 2 that affects the variation in the threshold voltage can be controlled at a unit of atomic layer. Further, a high precision is not required for the etching of the threshold voltage control layer 3 upon forming the recess structure 30 since the total thickness of the threshold voltage control layer 3 and the barrier layer 2 below the recess structure 30 does not affect the threshold voltage. Therefore, the threshold voltage can easily be controlled, and hence, a nitride-based semiconductor device having reduced on-resistance can be provided with good yield.

The condition for realizing a normally off-type structure in the nitride-based semiconductor device according to this embodiment will be explained. In the nitride-based semiconductor device shown in FIG. 1, the amount of the piezoelectric charge generated in the barrier layer 2 does not depend on a presence or an absence of the threshold voltage control layer 3 such as at the position in the recess structure 30 where the gate electrode 5 is formed or at the position where the source electrode 6 and the drain electrode 7 are formed. Therefore, the critical thickness $T_c$ of the barrier layer 2 in which the carrier is generated below the gate electrode 5 is represented by the following equation (4).

$$T_c=16.4\times(1-1.27\times(Y-X))/(Y-X) \text{ [Å]} \qquad (4)$$

Figure 8:
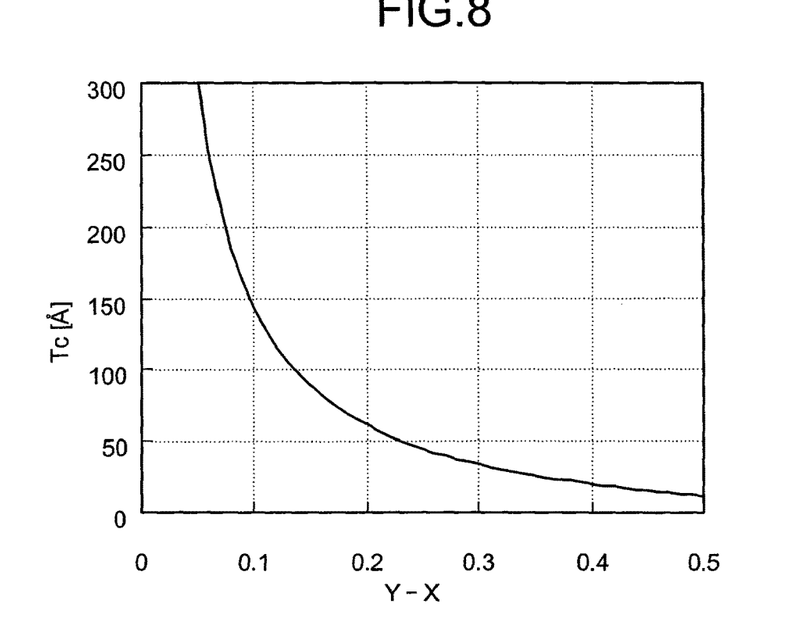
FIG. 8 is a graph showing a relationship between the difference in the composition ratio between the carrier traveling layer and the barrier layer and the critical thickness.

Here, Y is the Al composition of the barrier layer 2, and X is the Al composition of the carrier traveling layer 1. The reason why the critical thickness $T_c$ becomes the function of Y−X in the equation (4) is because the difference in the lattice constant between the carrier traveling layer 1 and the barrier layer 2 can be represented as the difference in the composition ratio between both of them. FIG. 8 is a graph showing the relationship between the difference in the composition ratio between the carrier traveling layer and the barrier layer and the critical thickness. FIG. 8 shows the equation (4) in the form of a graph representing a state in which the critical thickness $T_c$ depends upon the Al composition. Therefore, when the thickness $d_1$ of the barrier layer 2 is set so as to be not more than the critical thickness $T_c$, the carrier density of the two-dimensional electron system formed below the gate electrode 5 is made zero, whereby the normally off-type nitride-based semiconductor device can be realized. It should be noted that, in this case, the condition of Y−X<1/1.27 (=0.787) should be satisfied, considering the condition in which the critical thickness $T_c$ has to be positive.

Figure 9:
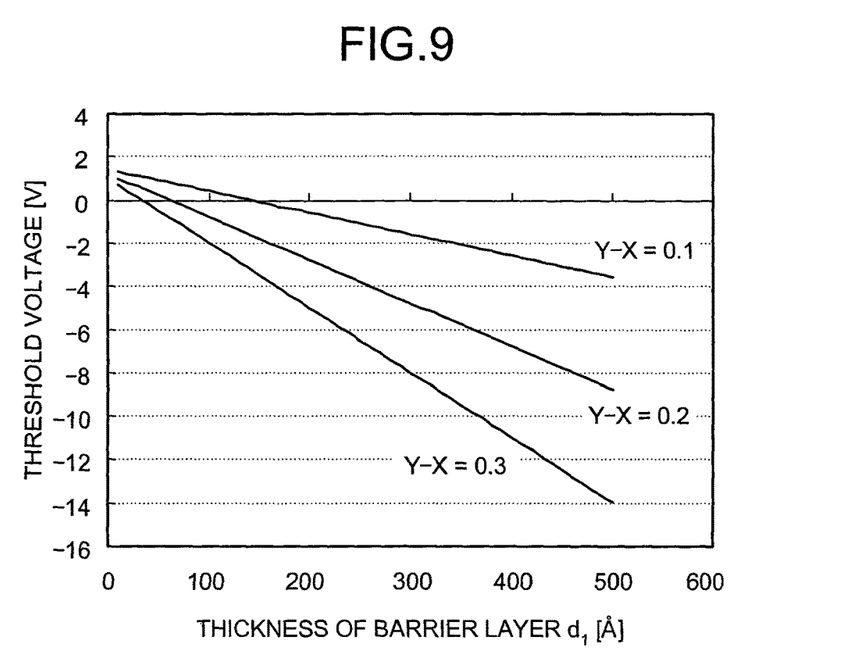
FIG. 9 is a graph showing a relationship between the thickness of the barrier layer and the threshold voltage.

When the normally off-type nitride-based semiconductor device is realized by the recess structure, the etching is performed such that the barrier layer 2 below the gate electrode 5 has the thickness not more than the critical thickness in the conventional semiconductor device explained in the related art. FIG. 9 is a graph showing the relationship between the thickness of the barrier layer and the threshold voltage. FIG. 9 represents the relationship of the threshold voltage to the thickness of the barrier layer 2 when the difference (Y−X) in the Al composition ratio between the barrier layer 2 and the carrier traveling layer 1 is changed from 0.1 to 0.3. As shown in this figure, the threshold voltage greatly depends upon the etching depth since the slope of each line is great. Accordingly, in the case of Y−X=0.3, for example, the variation in the threshold voltage is great such as 0.3 [V] even if the variation in the etching depth is relatively small such as 10 [Å].

In view of this, in the present embodiment, the barrier layer 2 is formed whose thickness is controlled by using an epitaxial crystal growth apparatus that can control a thickness in a level of atomic layer, and the recess structure is formed by removing a part of the threshold voltage control layer 3, on the barrier layer 2, whose thickness does not affect the threshold voltage, whereby the threshold voltage is determined by the barrier layer 2 whose thickness is controlled at a level of atomic layer. As a result, a normally off-type nitride-based semiconductor device having small variation in the threshold voltage can be obtained.

In the nitride-based semiconductor device shown in FIG. 1, the carrier inducing layer 4 having a thickness of $d_3$ is formed between the gate electrode 5 and the source electrode 6, and between the gate electrode 5 and the drain electrode 7. Therefore, the piezoelectric charge is generated, due to an emergence of the distortion, in the carrier inducing layer 4 having the lattice constant smaller than that of the carrier traveling layer 1, so that the two-dimensional electron system is generated at the interface between the carrier traveling layer 1 and the barrier layer 2. Specifically, the two-dimensional electron gas generated at the interface between the barrier layer 2 and the carrier traveling layer 1 depends upon the total thickness of the barrier layer 2 and the carrier inducing layer 4. As a result, the resistance between the gate electrode 5 and the source electrode 6 and between the gate electrode 5 and the drain electrode 7 can be reduced.

In order to realize this state, the total thickness $d_1+d_3$ of the barrier layer 2 and the carrier inducing layer 4 should be not less than the critical thickness $T_c$ represented by the equation (4). It should be noted that, in this case too, the condition of Y−X<1/1.27 (=0.787) should be satisfied, considering the condition in which the critical thickness $T_c$ has to be positive. As described above, the normally off-type nitride-based semiconductor device having reduced on-resistance can be obtained by controlling the thickness of the barrier layer 2 and the thickness of the carrier inducing layer 4.

Figure 10:
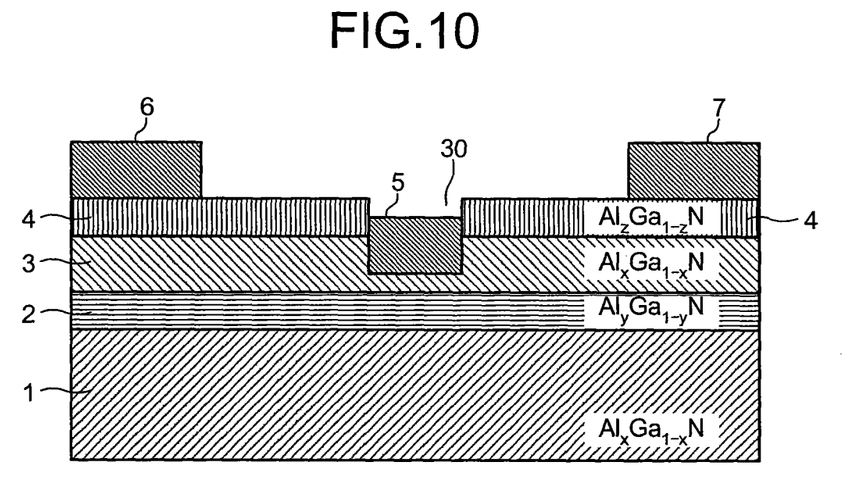
FIG. 10 is a sectional view showing another example of the structure of the nitride-based semiconductor device according to the present invention.

The nitride-based semiconductor device shown in FIG. 1 is only one example, and other configuration may be employed. FIGS. 10 to 15 are views each showing a configuration of a nitride-based semiconductor device according to a modified example of this embodiment. In the explanation of these drawings, elements having identical functions are identified by the same reference numerals and the descriptions thereof are not repeated. FIG. 10 is a sectional view showing another example of the configuration of the nitride-based semiconductor device according to this embodiment. The nitride-based semiconductor device shown in FIG. 10 has the gate electrode 5 formed at the recess structure 30 that is formed by removing the whole carrier inducing layer 4 and a part of the threshold voltage control layer 3 at the predetermined position, like the one shown in FIG. 1, but it is different from the one shown in FIG. 1 in that the end portion of the gate electrode 5 contacts the carrier inducing layer 4. Since the carrier density of the two-dimensional electron system below the recess structure is reduced, the resistance at the gap between the gate electrode 5 and the carrier inducing layer 4 is increased to bring the increase in on-resistance. Therefore, on-resistance can be reduced by the configuration shown in FIG. 10 in which the end portion of the gate electrode 5 is brought into contact with the carrier inducing layer 4.

Figure 11:
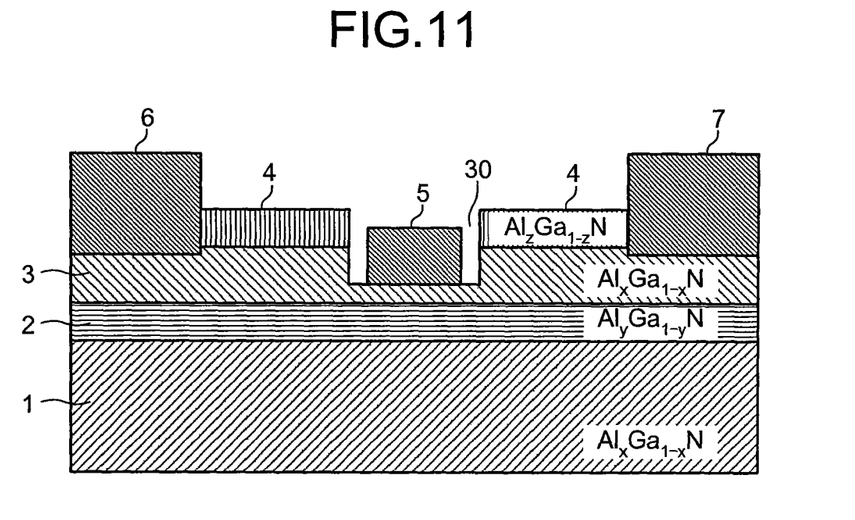
FIG. 11 is a sectional view showing another example of the structure of the nitride-based semiconductor device according to the present invention.
Figure 12:
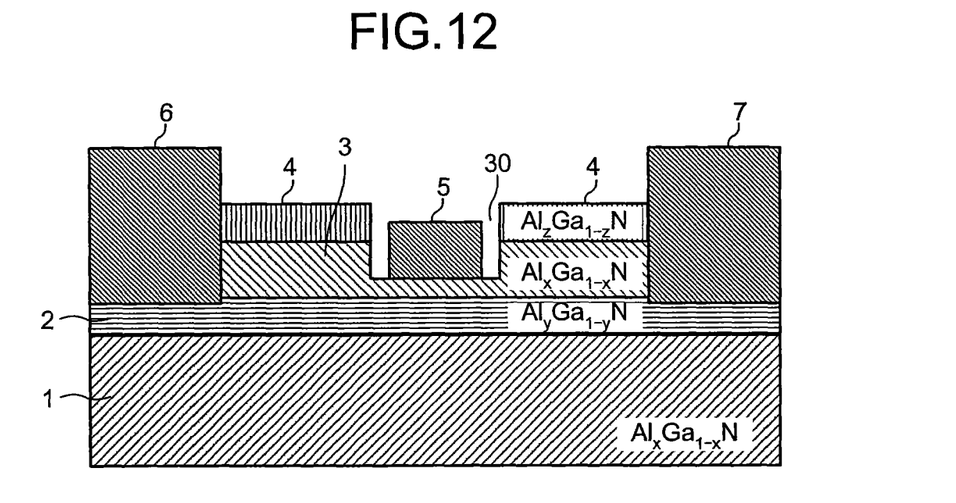
FIG. 12 is a sectional view showing another example of the structure of the nitride-based semiconductor device according to the present invention.

FIGS. 11 and 12 are sectional views each showing another example of a configuration of the nitride-based semiconductor device according to this embodiment. These examples are different from the one shown in FIG. 1 in that the source electrode 6 and the drain electrode 7 are not formed on the carrier inducing layer 4. Specifically, in the nitride-based semiconductor device shown in FIG. 11, the source electrode 6 and the drain electrode 7 are formed on the threshold voltage control layer 3, and in the nitride-based semiconductor device shown in FIG. 12, the source electrode 6 and the drain electrode 7 are formed on the barrier layer 2. As described above, the threshold voltage control layer 3 is formed to control the threshold voltage of the gate electrode 5, and the carrier inducing layer 4 is formed to reduce the resistance between the gate electrode 5 and the source electrode 6 and between the gate electrode 5 and the drain electrode 7, so that the threshold voltage control layer 3 and the carrier inducing layer 4 are not necessarily required under the source electrode 6 and the drain electrode 7. Therefore, the source electrode 6 and the drain electrode 7 are formed at the position close to the two-dimensional electron system generated at the interface between the carrier traveling layer 1 and the barrier layer 2 by removing the carrier inducing layer 4 or removing the carrier inducing layer 4 and the threshold voltage control layer 3 under the source electrode 6 and the drain electrode 7, with the result that the ohmic contact resistance can be reduced, and further, on-resistance can be reduced.

Figure 13:
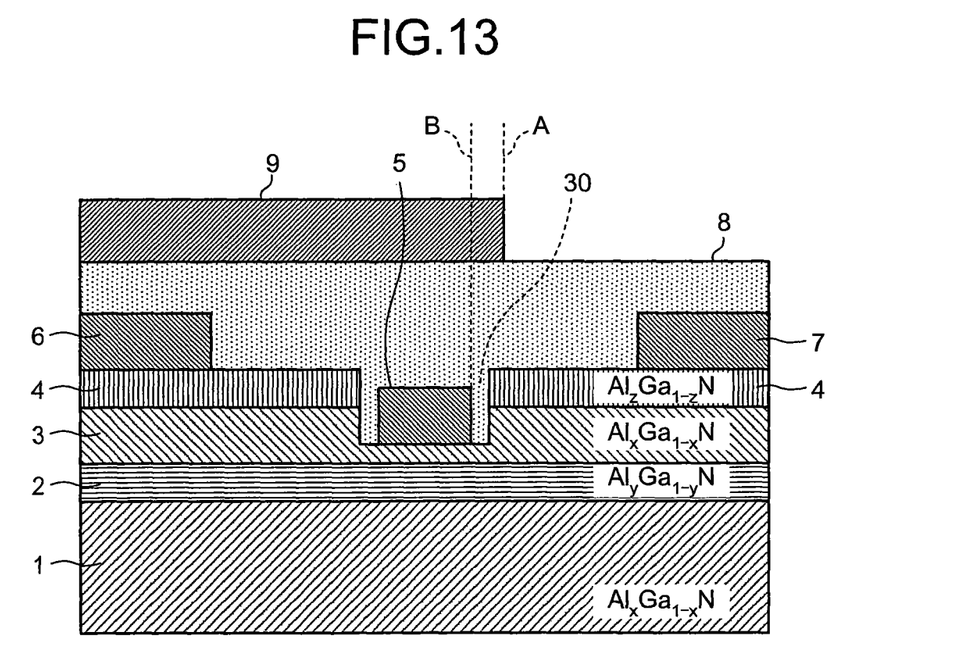
FIG. 13 is a sectional view showing another example of the structure of the nitride-based semiconductor device according to the present invention.

FIG. 13 is a sectional view showing another example of a configuration of the nitride-based semiconductor device according to this embodiment. In the nitride-based semiconductor device shown in FIG. 13, an insulating film 8 is formed on the nitride-based semiconductor device shown in FIG. 1, and a field plate electrode 9 is formed on the insulating film 8. The field plate electrode 9 is formed such that one end portion A thereof is positioned closer to the drain electrode 7 than the end portion B (right in the figure) of the gate electrode 5 at the side of the drain electrode 7 from the end portion on the insulating film 8 at the side where the source electrode 6 is formed. One end portion of the field plate electrode 9 is formed at the end portion on the insulating film 8 where the source electrode 6 is formed in FIG. 13. However, if the other end portion A of the field plate electrode 9 is positioned between the end portion B of the gate electrode 5 at the side of the drain electrode 7 and the drain electrode 7, the one end portion can freely be formed between the source electrode 6 and the drain electrode 7.

By providing the field plate electrode 9 as described above, the electric field concentration near the gate electrode 5 can be eased, when high voltage is applied between the source electrode 6 and the drain electrode 7, whereby a nitride-based semiconductor device having high breakdown voltage can be realized. It is desirable that the field plate electrode 9 is connected to the gate electrode 5 or the source electrode 6. With this structure, the threshold voltage can easily be controlled, while realizing high breakdown voltage, whereby a nitride-based semiconductor device having reduced on-resistance can be provided with good yield.

Figure 14:
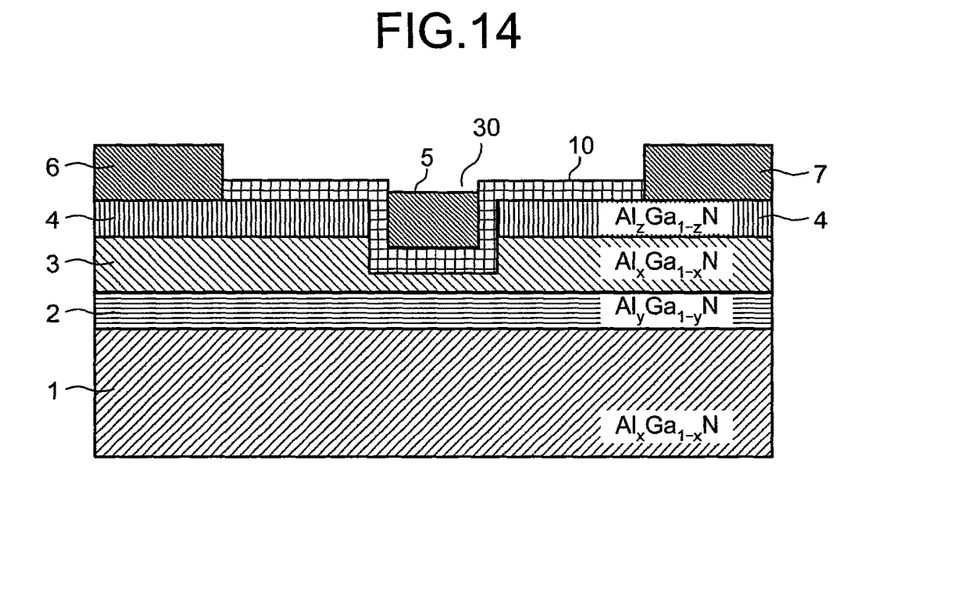
FIG. 14 is a sectional view showing another example of the structure of the nitride-based semiconductor device according to the present invention.

FIG. 14 is a sectional view showing another example of a configuration of the nitride-based semiconductor device according to this embodiment. In the nitride-based semiconductor device shown in FIG. 14, a gate insulating film 10 is formed on the carrier inducing layer 4 and in the recess structure 30, and the gate electrode 5 is formed on the gate insulating film 10 in the recess structure 30, in the nitride-based semiconductor device shown in FIG. 1. An SiN film that is reported to have less interface state with AlGaN film is desirably used as the gate insulating film 10.

The gate leak current can be reduced by providing the gate insulating film 10 between the gate electrode 5 and the threshold voltage control layer 3 as described above. As a result, the threshold voltage can easily be controlled, while realizing low leak current, whereby a nitride-based semiconductor device having reduced on-resistance can be provided with good yield.

Figure 15:
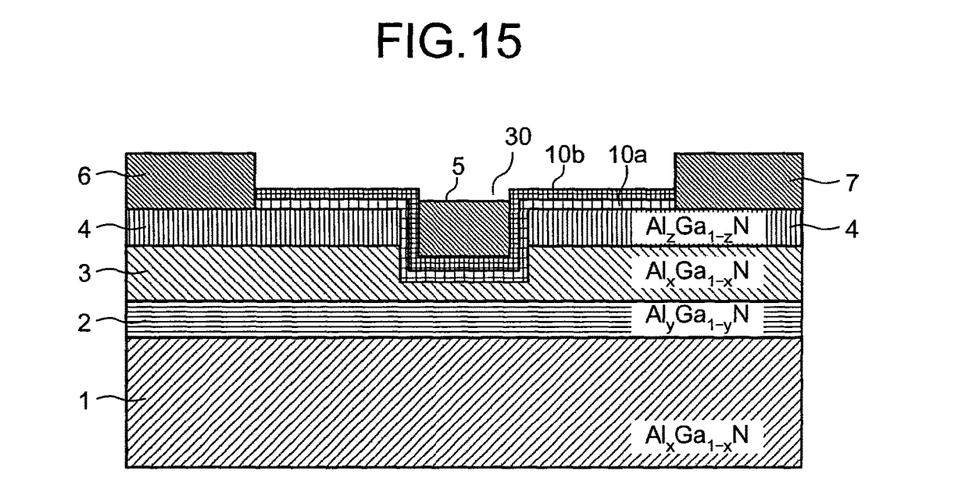
FIG. 15 is a sectional view showing another example of the structure of the nitride-based semiconductor device according to the present invention.

FIG. 15 is a sectional view showing another example of a configuration of the nitride-based semiconductor device according to this embodiment. In the nitride-based semiconductor device shown in FIG. 15, the gate insulating film 10 has a double-layer structure in the one shown in FIG. 14, wherein a material having less interface state with the threshold voltage control layer 3 is used as a lower gate insulating film 10a, like the case of the gate insulating film 10 in FIG. 14, and a material having higher critical breakdown electric field is used for an upper gate insulating film 10b. For example, a GaN film is used for the threshold voltage control layer 3, an SiN film is used for the gate insulating film 10a, and any one of $SiO_2$ film, $Al_2O_3$ film and AlN film is used for the gate insulating film 10b, thereby being capable of fabricating a nitride-based semiconductor device having the configuration shown in FIG. 15. By providing the double-layered gate insulating films 10a and 10b between the gate electrode 5 and the threshold voltage control layer 3, a gate having high breakdown voltage and high controllability of the carrier density can be formed.

According to this embodiment, the carrier traveling layer 1 composed of $Al_xGa_{1-x}N$ ($0 \leq X<1$) film, the barrier layer 2 composed of $Al_YGa_{1-Y}N$ (($0<Y \leq 1$, $X<Y$) film, the threshold voltage control layer 3 composed of a semiconductor having a lattice constant equal to that of the carrier traveling layer 1, and the carrier inducing layer 4 composed of a semiconductor having a lattice constant smaller than that of the carrier traveling layer 1, are successively laminated, and the gate electrode 5 is formed in the recess structure 30 formed by removing the whole of the carrier inducing layer 4 at the region where the gate electrode 5 is formed or the whole of the carrier inducing layer 4 and a part of the threshold voltage control layer 3, whereby a nitride-based semiconductor device whose threshold voltage can be controlled and that has reduced on-resistance can be provided with good yield.

In particular, the threshold voltage control layer and the carrier inducing layer are formed on the barrier layer in which a crystal growth is possible by a control of atomic layer, and the bottom portion of the recess structure is positioned in the threshold voltage control layer when the recess structure is formed, whereby the threshold voltage can precisely be controlled. Further, the carrier inducing layer in which piezoelectric charge is generated is formed between the gate electrode and the source electrode and between the gate electrode and the drain electrode where the recess structure is not formed. Therefore, the concentration of the two-dimensional electron gas produced at the interface between the carrier traveling layer and the barrier layer is increased together with the piezoelectric charge generated in the barrier layer, whereby reduced on-resistance can be realized. As a result, an effect is provided such that a nitride-based semiconductor device having desired threshold voltage and having reduced on-resistance can be provided with good yield.

The thickness of the barrier layer 2 is controlled to be not more than $16.4 \times (1-1.27 \times (Y-X))/(Y-X)$ [Å], and the total thickness of the barrier layer 2 and the carrier inducing layer 4 is controlled to be not less than $16.4 \times (1-1.27 \times (Y-X))/(Y-X)$ [Å], which brings the configuration in which the carrier is not present below the gate electrode 5 and the carrier is present between the gate electrode 5 and the source electrode 6 and between the gate electrode 5 and the drain electrode 7. Accordingly, a normally off-type nitride-based semiconductor device can be realized.

In particular, a first semiconductor layer and a second semiconductor layer are formed on a second nitride-based semiconductor layer in which a crystal growth is possible by a control of atomic layer, and the bottom portion of the recess structure is positioned in the first semiconductor layer when the recess structure is formed, whereby the threshold voltage can precisely be controlled. Further, the second semiconductor layer in which piezoelectric charge is generated is formed between the gate electrode and the source electrode and between the gate electrode and the drain electrode where the recess structure is not formed. Therefore, the concentration of the two-dimensional electron gas produced at the interface between the first nitride-based semiconductor layer and the second nitride-based semiconductor layer is increased together with the piezoelectric charge generated in the second nitride-based semiconductor layer, whereby reduced on-resistance can be realized. As a result, an effect is provided such that a nitride-based semiconductor device having desired threshold voltage and having reduced on-resistance can be provided with good yield.

As described above, the nitride-based semiconductor device according to the present invention is useful for a power semiconductor device such as a switching device or high-frequency power semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nitride-based semiconductor device comprising:
   a first semiconductor layer made of non-doped GaN;
   a second semiconductor layer formed on and directly contacting the first semiconductor layer, the second semiconductor layer being made of non-doped or n-type $Al_YGa_{1-Y}N$ ($0<Y\leq1$) having a lattice constant smaller than a lattice constant of the first semiconductor layer;
   a gate insulating film formed so as to cover a recess structure and the second semiconductor layer, a bottom of the recess structure being positioned below a boundary between the first semiconductor layer and the second semiconductor layer, the gate insulating film including a first region and a second region, the first region covering a side face of the recess structure, the first region contacting the first semiconductor layer and the second semiconductor layer, and the second region covering the bottom of the recess structure;
   a gate electrode formed on the gate insulating film in the recess structure, the gate electrode being insulated from the first semiconductor layer and the second semiconductor layer by the gate insulating film; and
   a source electrode and a drain electrode formed on the second semiconductor layer, wherein the gate electrode is positioned between the source electrode and the drain electrode, and the nitride-based semiconductor device is a normally off-type nitride-based semiconductor device.

2. The nitride-based semiconductor device according to claim 1, further comprising:
   an insulating film formed so as to cover the gate electrode, the source electrode, and the drain electrode; and
   a field plate electrode formed on the insulating film such that a first distance between at least one end portion of the field plate electrode and the drain electrode is smaller than a second distance between an end portion of the gate electrode at a side of the drain electrode and the drain electrode, the first distance and the second distance being each a distance in a direction that is vertical relative to a depth direction, the field plate electrode being connected to the gate electrode or the source electrode.

3. The nitride-based semiconductor device according to claim 1, wherein
   the gate insulating film has a double-layer structure.

4. The nitride-based semiconductor device according to claim 1, wherein
   the first region includes a first surface and a second surface,
   the first surface directly contacts the first semiconductor layer and the second semiconductor layer, and
   the second surface directly contacts the gate electrode.

* * * * *